(12) United States Patent
Zaitsau

(10) Patent No.: US 11,967,391 B2
(45) Date of Patent: Apr. 23, 2024

(54) SYSTEM AND METHOD FOR TESTING MULTICORE SSD FIRMWARE BASED ON PRECONDITIONS GENERATION

(71) Applicant: SK hynix Inc., Gyeonggi-do (KR)

(72) Inventor: Yahor Zaitsau, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/396,185

(22) Filed: Aug. 6, 2021

(65) Prior Publication Data

US 2023/0038605 A1 Feb. 9, 2023

(51) Int. Cl.
*G11C 29/38* (2006.01)
*G06F 3/06* (2006.01)
(Continued)

(52) U.S. Cl.
CPC ............ *G11C 29/46* (2013.01); *G06F 3/0616* (2013.01); *G06F 3/064* (2013.01); *G06F 3/0653* (2013.01);
(Continued)

(58) Field of Classification Search
CPC .............. G11C 29/028; G11C 29/44; G11C 2029/0409; G11C 2029/0411; G11C 29/12; G11C 29/4401; G11C 29/52; G11C 11/16; G11C 2029/3602; G11C 29/42; G11C 29/70; G11C 11/406; G11C 13/0002; G11C 16/3418; G11C 2029/2602; G11C 29/08; G11C 29/24; G11C 29/38; G11C 29/50; G11C 29/56008; G11C 29/785; G11C 29/832; G11C 2029/5602; G11C 29/06; G11C 29/10; G11C 29/12015; G11C 29/36; G11C 29/50012; G11C 29/56; G11C 11/161; G11C 11/22; G11C 11/2293; G11C 11/2297; G11C 16/0483; G11C 16/10; G11C 16/12; G11C 16/20; G11C 16/30;
(Continued)

(56) References Cited

U.S. PATENT DOCUMENTS 6,381,715 B1 * 4/2002 Bauman ................. G11C 29/48
365/201
8,239,618 B2 8/2012 Kotzur et al.
(Continued)

OTHER PUBLICATIONS

Kim J et al., Performance Evaluation of Multi-threaded Flash Translation Layer, International Journal of Applied Engineering Research, 2017, pp. 8937-8940, vol. 12, No. 19, Research India Publications.

(Continued)

*Primary Examiner* — Steve N Nguyen
(74) *Attorney, Agent, or Firm* — IP & T GROUP LLP

(57) ABSTRACT

Embodiments of the present disclosure provide a system for testing multicore firmware (FW) in a memory system and a method thereof. A test system includes a test device and a storage device including a plurality of flash translation layer (FTL) cores, each FTL core associated with multiple memory blocks. The test device generates test preconditions for the plurality of FTL cores and provides the test preconditions to the plurality of FTL cores, the test preconditions being different from each other. Each of the plurality of FTL cores performs one or more test operations based on a corresponding test precondition of the test preconditions.

20 Claims, 11 Drawing Sheets

(51) Int. Cl.
*G11C 29/36* (2006.01)
*G11C 29/46* (2006.01)

(52) U.S. Cl.
CPC .......... *G06F 3/0659* (2013.01); *G06F 3/0679* (2013.01); *G11C 29/36* (2013.01); *G11C 29/38* (2013.01)

(58) Field of Classification Search
CPC . G11C 16/32; G11C 16/3427; G11C 16/3486; G11C 2029/5002; G11C 2211/4062; G11C 29/021; G11C 29/022; G11C 29/1201; G11C 29/14; G11C 29/16; G11C 29/20; G11C 29/50004; G11C 29/50008; G11C 29/50016; G11C 29/72; G11C 13/0007; G11C 13/0011; G11C 13/0023; G11C 13/0035; G11C 13/004; G11C 13/0069; G11C 2013/0083; G11C 2029/0403; G11C 2029/4402; G11C 2213/71; G11C 29/025; G11C 29/12005; G01R 31/3171; G01R 31/2822; G01R 31/31813; G01R 31/2884; G01R 31/31703; G01R 31/31709; G01R 31/3177; G01R 31/318307; G01R 31/31908; G01R 31/3193; G01R 31/58; G01R 31/28; G01R 31/2801; G01R 31/31708; G01R 31/31724; G01R 31/3183; G01R 31/318357; G01R 31/318371; G01R 31/31919; G01R 31/31932; H03M 13/1515; H03M 13/05; H03M 13/1102; H03M 13/152; H03M 13/451; H03M 13/458; H03M 13/3961; H03M 13/41; H03M 13/6331; H03M 13/6343; G06F 11/3037; G06F 11/3409; G06F 2201/81; G06F 1/08; G06F 1/324; G06F 1/3275; G06F 11/008; G06F 11/1048; G06F 11/076; G06F 11/24; G06F 11/263; G06F 11/221; G06F 1/3206; G06F 1/3225; G06F 1/3296; G06F 11/00; G06F 15/7821; G06F 17/10; G06F 21/00; G06F 3/0659; G06F 3/0679; G06F 11/1012; G06F 11/2268; G06F 11/2294; G06F 11/27; G06F 12/00; G06F 13/364; G06F 13/4022; G06F 13/4282; G06F 13/4291; G06F 21/554; G06F 2213/0026; G06F 3/0616; G06F 3/064; G06F 9/00; G06F 11/0727; G06F 11/0775; G06F 11/2221; G06F 11/3034; G06F 11/3075; G06F 17/18; G06F 21/552; G06F 21/566; G06F 21/567; G06F 2221/033; G06F 2221/034; G06F 3/0604; G06F 30/20

See application file for complete search history.

(56) References Cited

U.S. PATENT DOCUMENTS

| | | | |
|---|---|---|---|
| 9,965,198 B2 | 5/2018 | Hallett et al. | |
| 2007/0088940 A1* | 4/2007 | Conley | G11C 16/20 713/1 |
| 2009/0259803 A1* | 10/2009 | Oh | G11C 16/349 711/E12.008 |
| 2012/0072789 A1* | 3/2012 | Chen | G11C 29/06 714/E11.002 |
| 2013/0275651 A1* | 10/2013 | D'Abreu | G11C 16/10 711/E12.008 |
| 2014/0047287 A1* | 2/2014 | Lee | G06F 13/4022 714/719 |
| 2015/0178191 A1* | 6/2015 | Camp | G06F 12/0246 711/103 |
| 2016/0350023 A1* | 12/2016 | Lesartre | G11C 13/0033 |
| 2018/0165010 A1* | 6/2018 | Tai | G06F 12/0246 |
| 2019/0018597 A1* | 1/2019 | Zhang | G06F 3/0688 |
| 2019/0130990 A1* | 5/2019 | Liu | G11C 29/10 |
| 2019/0295681 A1* | 9/2019 | Kim | G11C 29/42 |
| 2022/0066924 A1* | 3/2022 | Chen | G06F 12/0246 |

OTHER PUBLICATIONS

K. Gopinath S et al., LFTL: A multi-threaded FTL for a Parallel IO Flash Card under Linux, Feb. 2013, vol. 1.

* cited by examiner

SYSTEM AND METHOD FOR TESTING MULTICORE SSD FIRMWARE BASED ON PRECONDITIONS GENERATION

BACKGROUND

1 Field

Embodiments of the present disclosure relate to a test system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having a memory device(s), that is, a data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may be tested using various test tools.

SUMMARY

Aspects of the present invention include a system for testing multicore firmware (FW) in a memory system and a method thereof.

In one aspect of the present invention, a test system includes a test device and a storage device including a plurality of flash translation layer (FTL) cores, each FTL core associated with multiple memory blocks. The test device is configured to: generate test preconditions for the plurality of FTL cores and provide the test preconditions to the plurality of FTL cores, the test preconditions being different from each other. Each of the plurality of FTL cores performs one or more test operations based on a corresponding test precondition of the test preconditions.

In another aspect of the present invention, a method for testing a storage device including a plurality of flash translation layer (FTL) cores, each FTL core associated with multiple memory blocks, includes: generating, by a test device, test preconditions for the plurality of FTL cores; providing, by the test device, the test preconditions to the plurality of FTL cores, the test preconditions being different from each other; and performing, by each of the plurality of FTL cores, one or more test operations based on a corresponding test precondition of the test preconditions.

Additional aspects of the present invention will become apparent from the following description.

DETAILED DESCRIPTION

Figure 1:
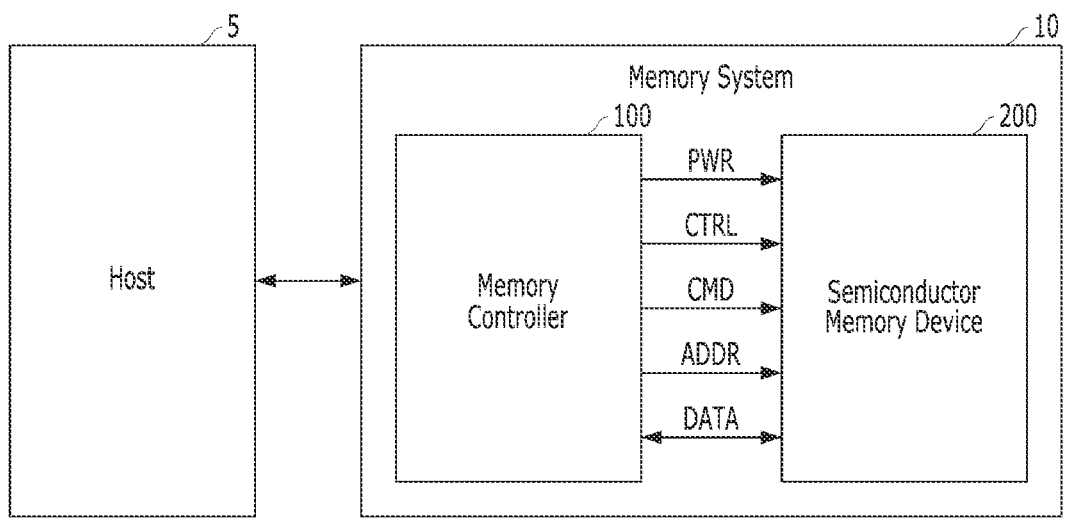
FIG. 1 is a block diagram illustrating a data processing system in accordance with an embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features nay include, for example, a memory or other storage device for storing code or instructions to be executed, for example, by a computer, processor, microprocessor, controller, or other signal processing device.

A detailed description of embodiments of the present invention is provided below along with accompanying figures that illustrate aspects of the present invention. The present invention is described in connection with such embodiments, but the present invention is not limited to any embodiment. The scope of the present invention is limited only by the claims. The present invention encompasses numerous alternatives, modifications and equivalents within the scope of the claims. Numerous specific details are set forth in the following description in order to provide a thorough understanding of the present invention. These details are provided for the purpose of example; the present invention may be practiced according to the claims without some or all of these specific details. For clarity, technical material that is known in technical fields related to the present invention has not been described in detail so that the present invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a person& computer (PC) card of person& computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
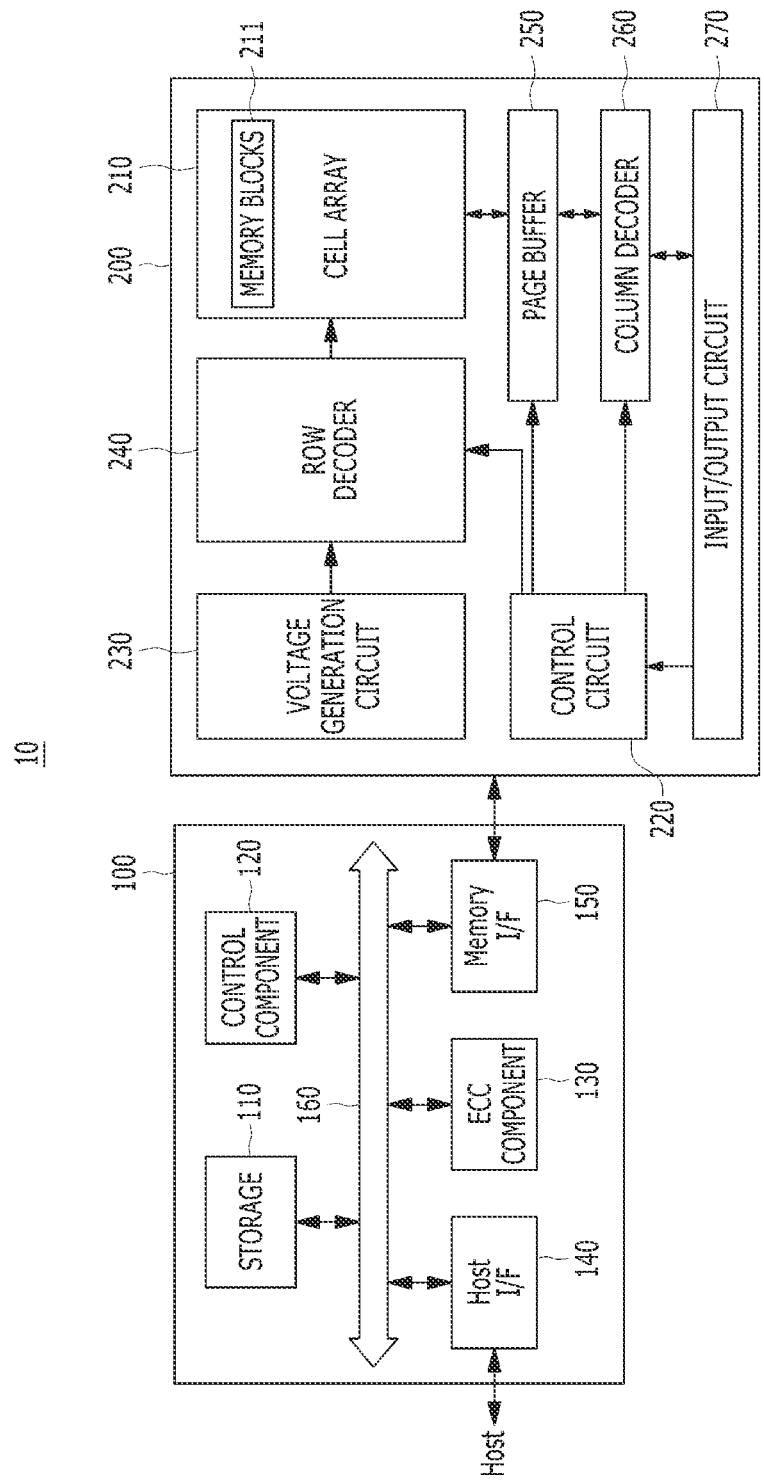
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM), The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120 which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and may store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM), As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200 in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various communication standards or interfaces such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (DATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250 which may be in the form of an array of page buffers, a column decoder 260, and an input and output (input/output) circuit 270, The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
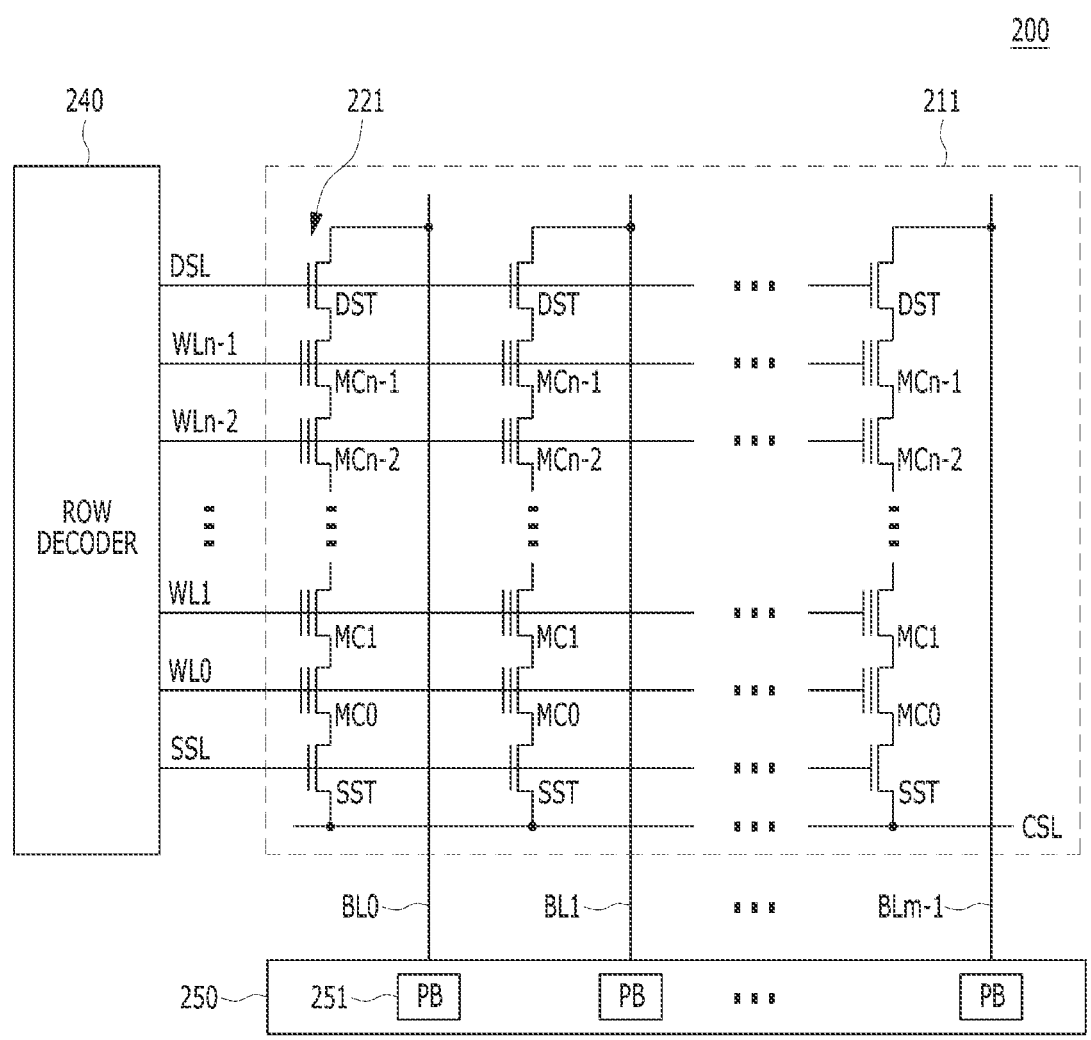
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 may transmit data to and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn-1, a drain select line DSL and a source select line SSL coupled to the row decoder 240, These lines may be arranged in parallel, with the plurality of word lines between the DSL and SSL.

The memory block 211 may further include a plurality of cell strings 221 respectively coupled to bit lines BL0 to BLm-1. The cell string of each column may include one or more drain selection transistors DST and one or more source selection transistors SST, In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data, Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page, Therefore, the number of physical pages in the memory block 211 may correspond to the number of word lines.

The page buffer array 250 may include a plurality of page buffers 251 that are coupled to the bit lines BL0 to BLm-1, The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
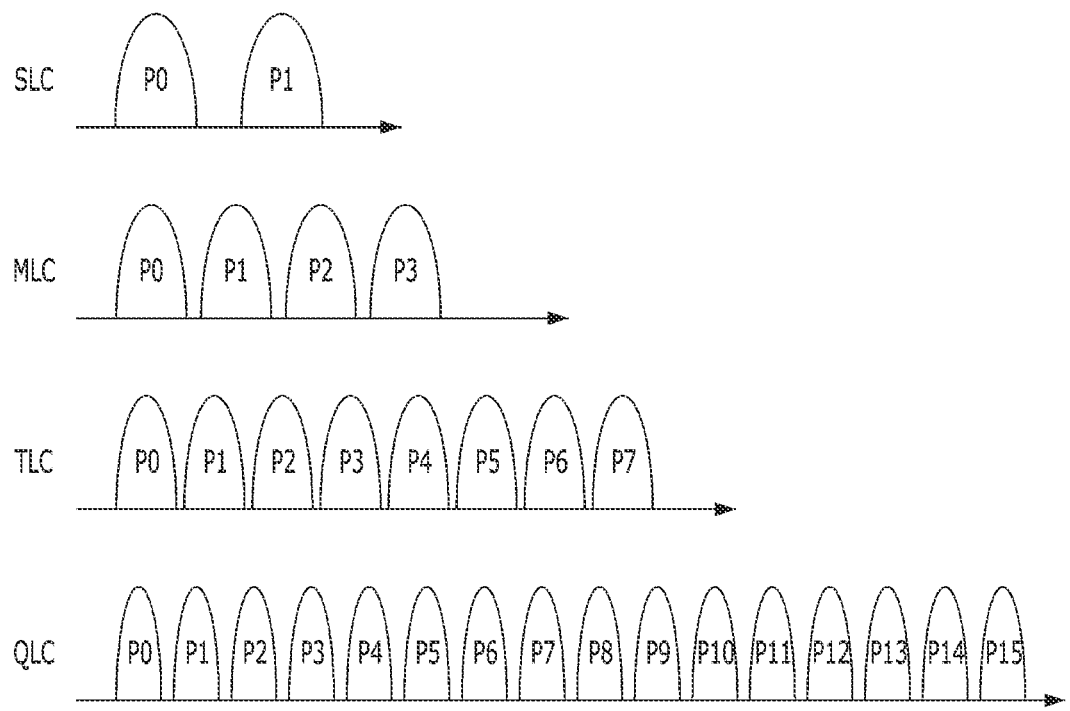
FIG. 4 is a diagram illustrating distributions of states for different types of cells of a memory device in accordance with an embodiment of the present invention.

FIG. 4 is a diagram illustrating distributions of states or program voltage (PV) levels for different types of cells of a memory device in accordance with an embodiment of the present invention.

Referring to FIG. 4, each of the memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data, Usually, all memory cells in a particular memory device are of the same type, but that is not a requirement.

An SLC may include two states P0 and P1. P0 may indicate an erase state, and P1 may indicate a program state, Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states, Since the TLC can be set in one of eight different states, each TLC may program or store three bits according to a set coding method, A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells). The memory cells are arranged in an array of rows and columns as shown in FIG. 3. The cells in each row are connected to a word line (e.g., WL0), while the cells in each column are coupled to a bit line (e.g., BL0), These word and bit lines are used for read and write operations. During a write operation, the data to be written ('1' or '0') is provided at the bit line while the word line is asserted. During a read operation, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5:
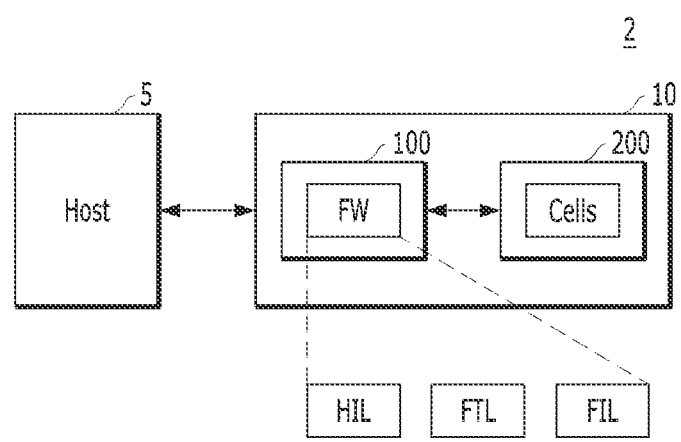
FIG. 5 is a diagram illustrating a data processing system in accordance with an embodiment of the present invention.

FIG. 5 is a diagram illustrating a data processing system 2 in accordance with an embodiment of the present invention.

Referring to FIG. 5, the data processing system 2 may include a host 5 and a memory system (i.e., a storage device) 10. The storage device 10 may include a controller 100 and a memory device 200. The memory device 200 may include a plurality of memory cells (e.g., NAND flash memory cells), The memory cells are arranged in an array of rows and columns as shown in FIG. 3. The cells in a particular row are connected to a word line (e.g., WL0), while the cells in a particular column are coupled to a bit line (e.g., BL0). These word and bit lines are used for read and write operations. During a write operation, the data to be written ('1' or '0') is provided at the bit line while the word line is asserted. During a read operation, the word line is again asserted, and the threshold voltage of each cell can then be acquired fro the bit line. Multiple pages may share the memory cells that belong to (e.g., are coupled to) the same word line.

The controller 100 may include firmware (FW) which is a specific class of software for controlling various operations (e.g., read, write, and erase operations) for the memory device 200. In some embodiments, the firmware may reside in the storage 110 and may be executed by the control component 120, in FIG. 2.

The firmware may include a host interface layer (HIL) controlling communication with the host 5, a flash translation layer (FTL) controlling communication between the host 5 and the memory device 200, and a flash interface layer (FIL) controlling communication with the memory device 200, FTL is the most complex part of the firmware.

Firmware of the storage device 10 such as a solid state drive (SSD) may be tested through various test approaches (e.g., black box, white box and unit tests). Testing the SSD (e.g., firmware) with the black box and white box tests includes sending some commands to the SSD and checking the expected results. The SSD for the test may be a real SSD or SSD simulator. Further, the SSD should be preconditioned for a test. Making a precondition for a test means turning the SSD (e.g., a NAND flash memory, a storage (e.g., RAM) or firmware) into some specific predefined states. The test will run based on such initial test conditions (i.e., test preconditions). Here, the test of FTL is a difficult and important task. Accordingly, embodiments provide a test scheme for effectively testing firmware of a multicore storage device. In particular, some embodiments provide a test system for testing FTLs of the multicore SSD based on various preconditions generation and a method thereof.

Figure 6:
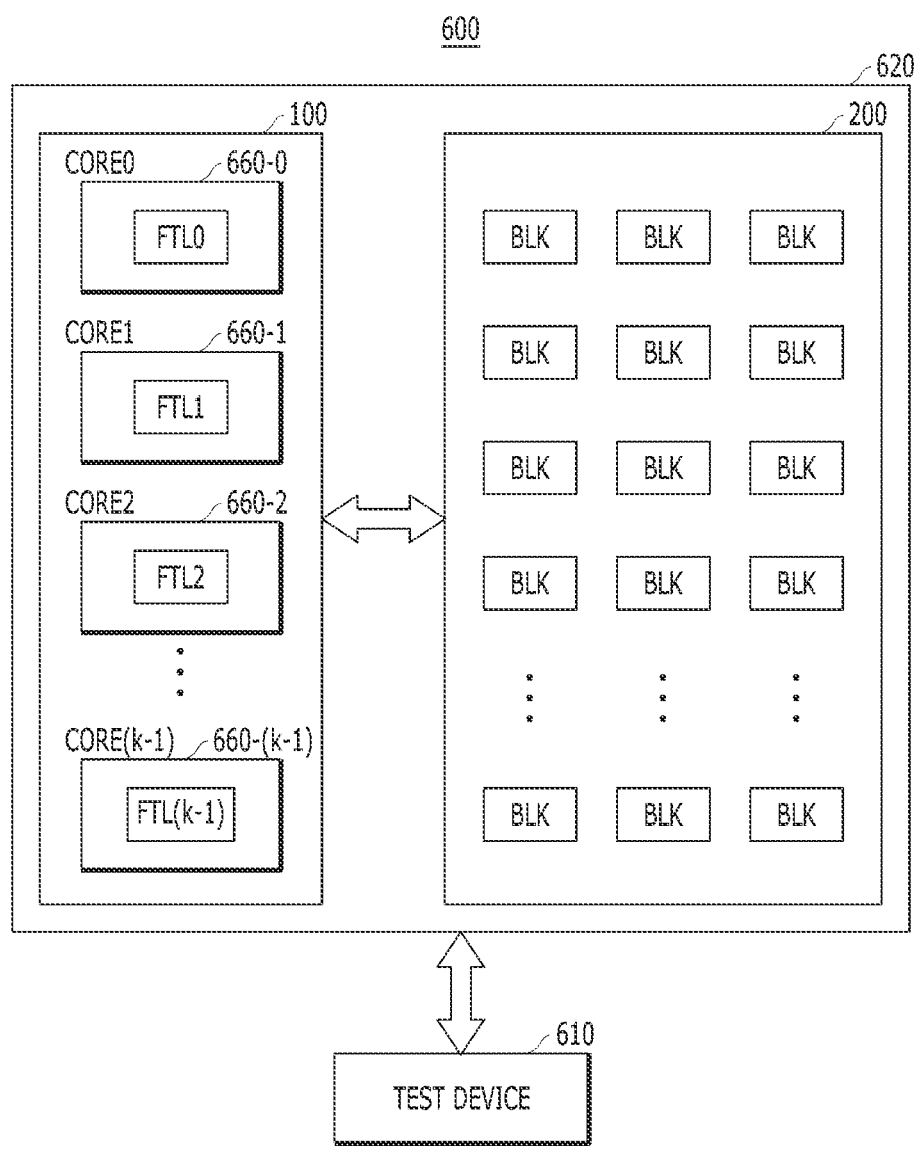
FIG. 6 is a diagram illustrating a test system in accordance with an embodiment of the present invention.

FIG. 6 is a diagram illustrating a test system 600 in accordance with an embodiment of the present invention.

Referring to FIG. 6, the test system 600 may include a test device 610 and a storage device 620. In some embodiments, the test device 610 may be a real host device (e.g., the host 5 of FIG. 5) or a virtual host device (i.e., host simulator) coupled to the storage device 620. Alternatively, the test device 610 may be included within the storage device 620.

The storage device 620 may include a controller 100 and a memory device 200. In some embodiments, the storage device 620 may be a multicore solid state drive (SSD). For the multicore SSD, the controller 100 may include multiple central processing unit (CPU) cores, e.g., k cores 660-0 to 660-(k−1), and the memory device 200 may include a NAND flash memory with a plurality of memory blocks (BLKs). Multiple cores 660-0 to 660-(k−1) may include flash translation layers FTL0 to FTL(k−1), respectively.

As modern SSD capacity is growing very fast, it becomes impossible to create test preconditions in a "true" way, e.g., by sending input and output (IO) commands, because it takes a lot of time. Instead, the precondition generation technique may be used to make preconditioning almost immediate for both the real hardware (HW) platform and the simulation platform.

Several CPU cores are doing the same or similar things, like running multiple flash translation layer (FTL) instances. Such double work is useless from the testing point of view because the same test may be just repeated in parallel to those multiple cores, FTL instances may run on separate physical CPU cores or may share the same CPU core.

The test system 600 may focus on FTL verification as most other FW components (HIL, FIL) are effectively tested with unit tests and black box tests, Each FTL may consist of many subcomponents with lots of interconnections, which makes its verification a difficult task. The test system 600 may test FTLs of the multicore SSD based on various preconditions generation while considering the following:

FTL may be tested with various tests such as black box, white box and unit tests. Black box and white box tests run entire FTL codes either in a real device or in a virtual device (simulator).

Test preconditions may be some specific states of the storage device.

Tests may or may not use preconditions. However, usually, long-term processes in FTL (e.g., garbage collection (GC), wear levelling (WL)) may be much more convenient to verify if the storage device is already in such a state or not far frons it. Otherwise, tests will do the same routine steps to achieve the target process.

Figure 7A:
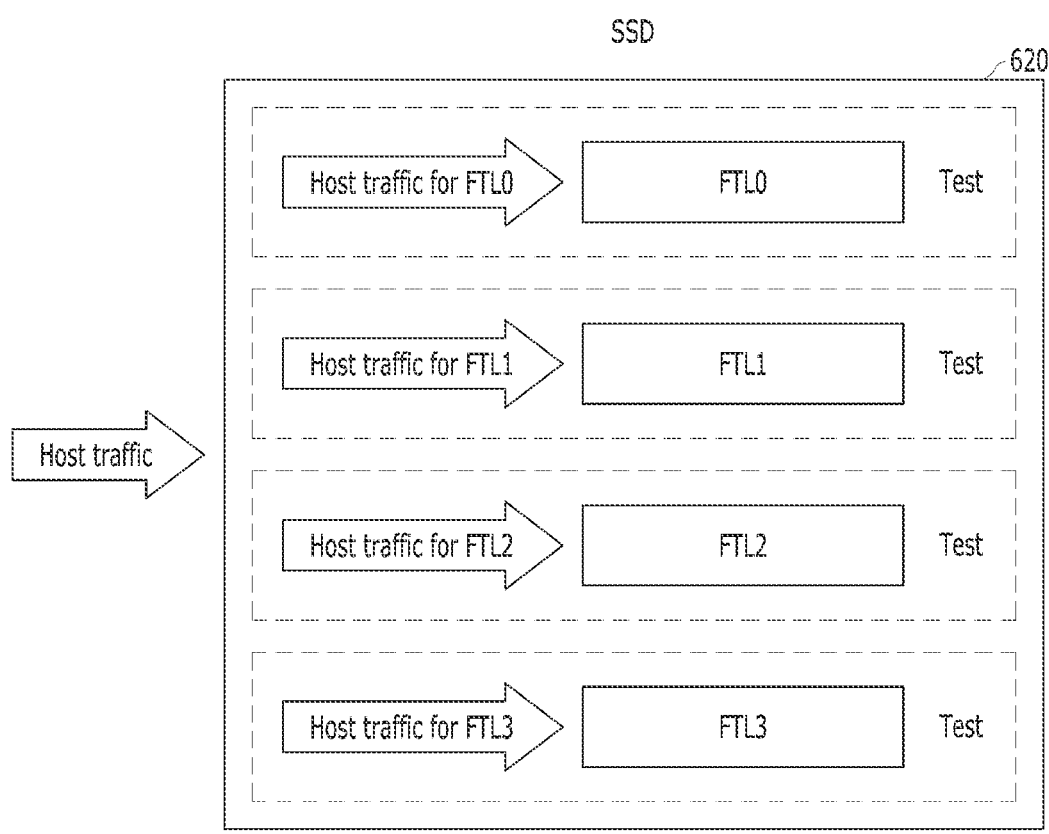
FIGS. 7A and 7B are diagrams illustrating an operation in accordance with a conventional preconditioning scheme.
Figure 7B:
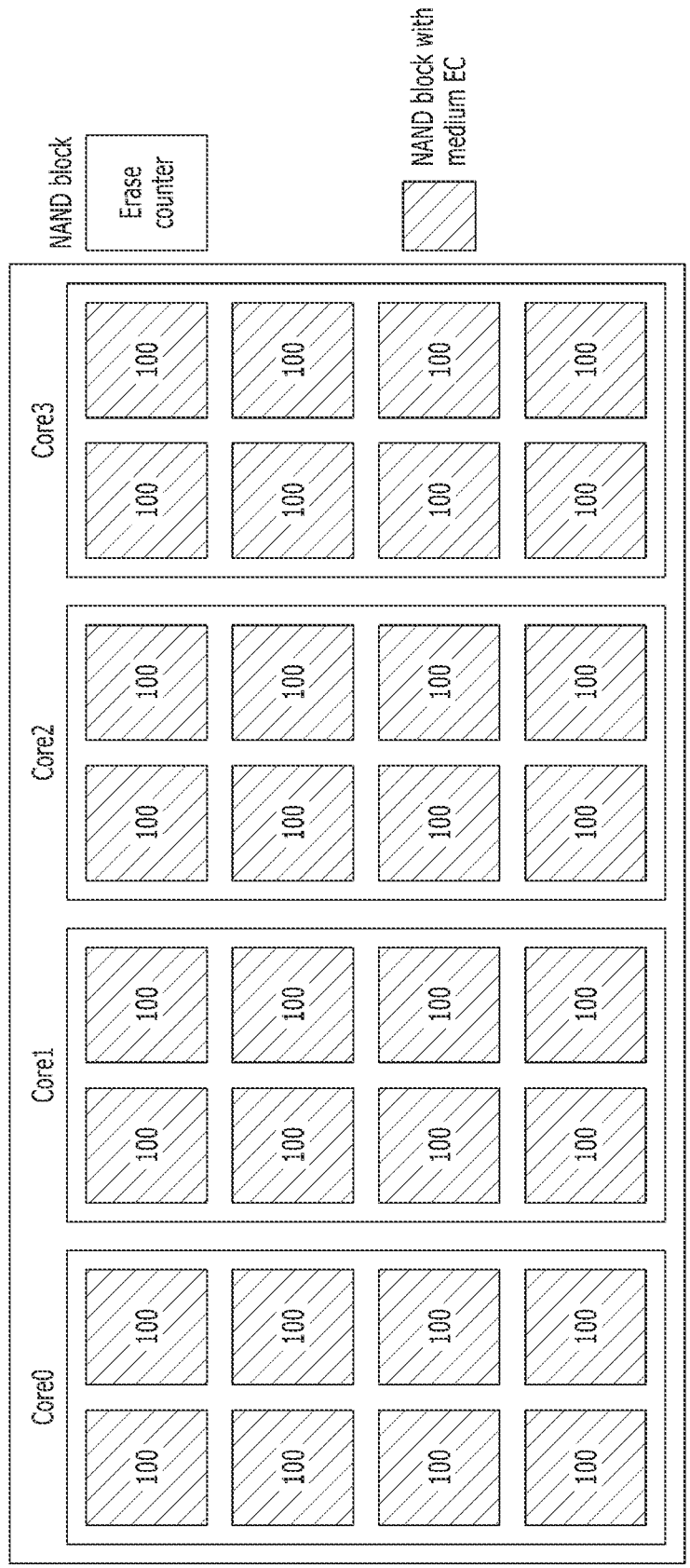

FIGS. 7A and 7B are diagrams illustrating an operation in accordance with a conventional preconditioning scheme which has been proposed.

Referring to FIGS. 7A and 7B, the same precondition on all FTLs is generated and thus the same test for all FTLs is performed based on the same state on all FTLs. In the illustrated example of FIG. 7B, NAND memory blocks associated with all FTL cores Core0 to Core3 may be on the same wear levelling (WL) state (i.e., a set medium erase counter (EC) value). In this situation, a sequence of commands (e.g., host traffic) coming to different FTLs may be the same as shown in FIG. 7A. Thus, tests running on all FTLs are the same since the same precondition are used and a sequence of commands (e.g., host traffic) provided to different FTLs are the same, Even if a sequence of commands provided to different FTLs may slightly differ, tests running on all FTLs are mostly the same because the same precondition is used. That is, the same test may be performed on the different FTLs (or cores).

As such, when the conventional preconditioning scheme which has been proposed is used, all FTLs get the same initial precondition. As illustrated in FIG. 7B, all FTLs may have WL of a similar intensity for approximately the same time. Therefore, a case where there is WL for a long time, or a case where there is not WL may be not covered by the test.

In order to cover various test cases, the test system 600 in FIG. 6 provides testing FTLs of the storage device 620 (e.g., a multicore SSD) based on various preconditions generation. The test system 600 may provide different tests for different FTLs.

Figure 8:
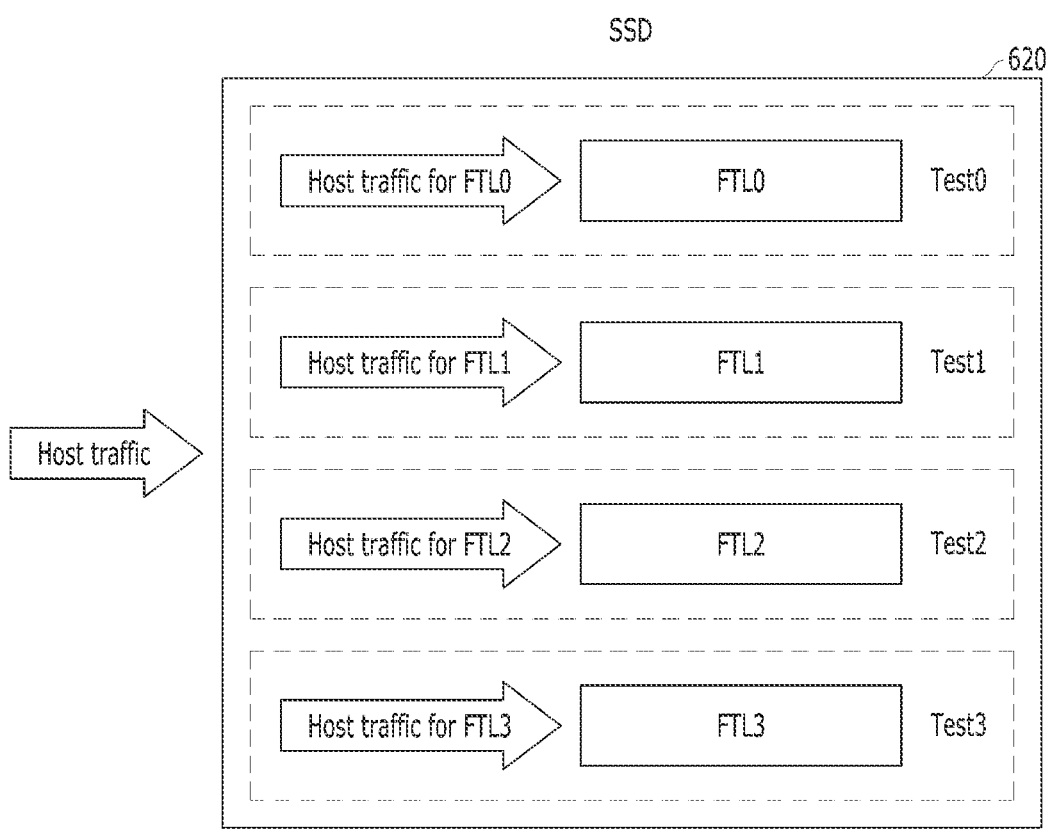
FIG. 8 is a diagram illustrating a test operation of a multicore storage device in accordance with an embodiment of the present invention.

FIG. 8 is a diagram illustrating a test operation for FTLs in accordance with an embodiment of the present invention.

Referring to FIG. 8, different tests may be performed for different FTLs. In the illustrated example of FIG. 8, a test Test0 may be running on FTL0, a test Test1 may be running on FTL1, a test Test2 may be running on FTL2 and a test Test3 may be running on FTL3. For this test scheme, different preconditions may be generated for different FTLs.

This test scheme may allow reducing the number of the required real SSDs or simulation instances N times to reach the same results, where N is the number of cores. If the resource amount is kept fixed, N times more tests may be run within the same time. In fact, if excessive tests are performed and different preconditions are generated in which test cases are not duplicated on FTL cores, a total test time nay be reduced.

This test scheme may be useful for effective A/B testing (also known as bucket testing or split-run testing) implementation. Instead of 2 test runs to check options A and B, it is enough to spread experiments A and B to different FTL instances to have just 1 test run.

Figure 9:
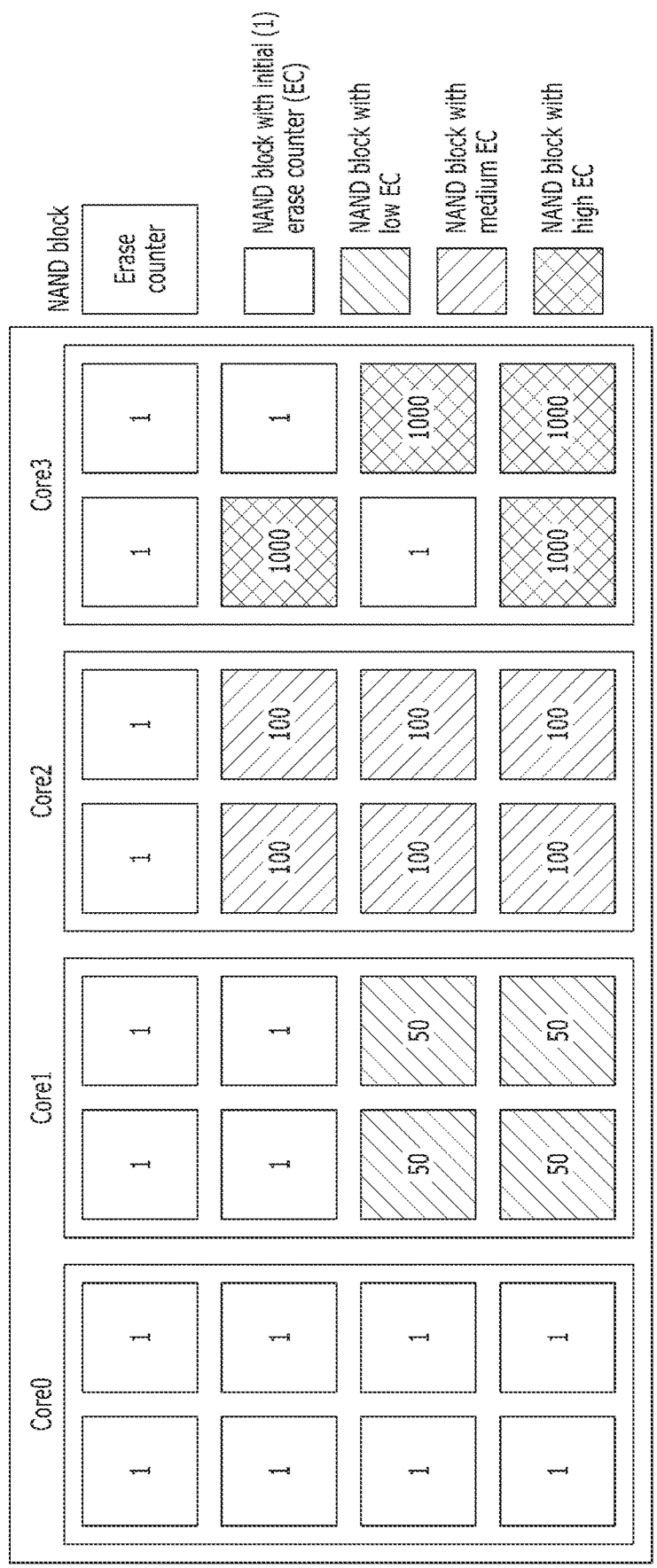
FIGS. 9 and 10 are diagrams illustrating different preconditions generation operations of a test system in accordance with an embodiment of the present invention.
Figure 10:
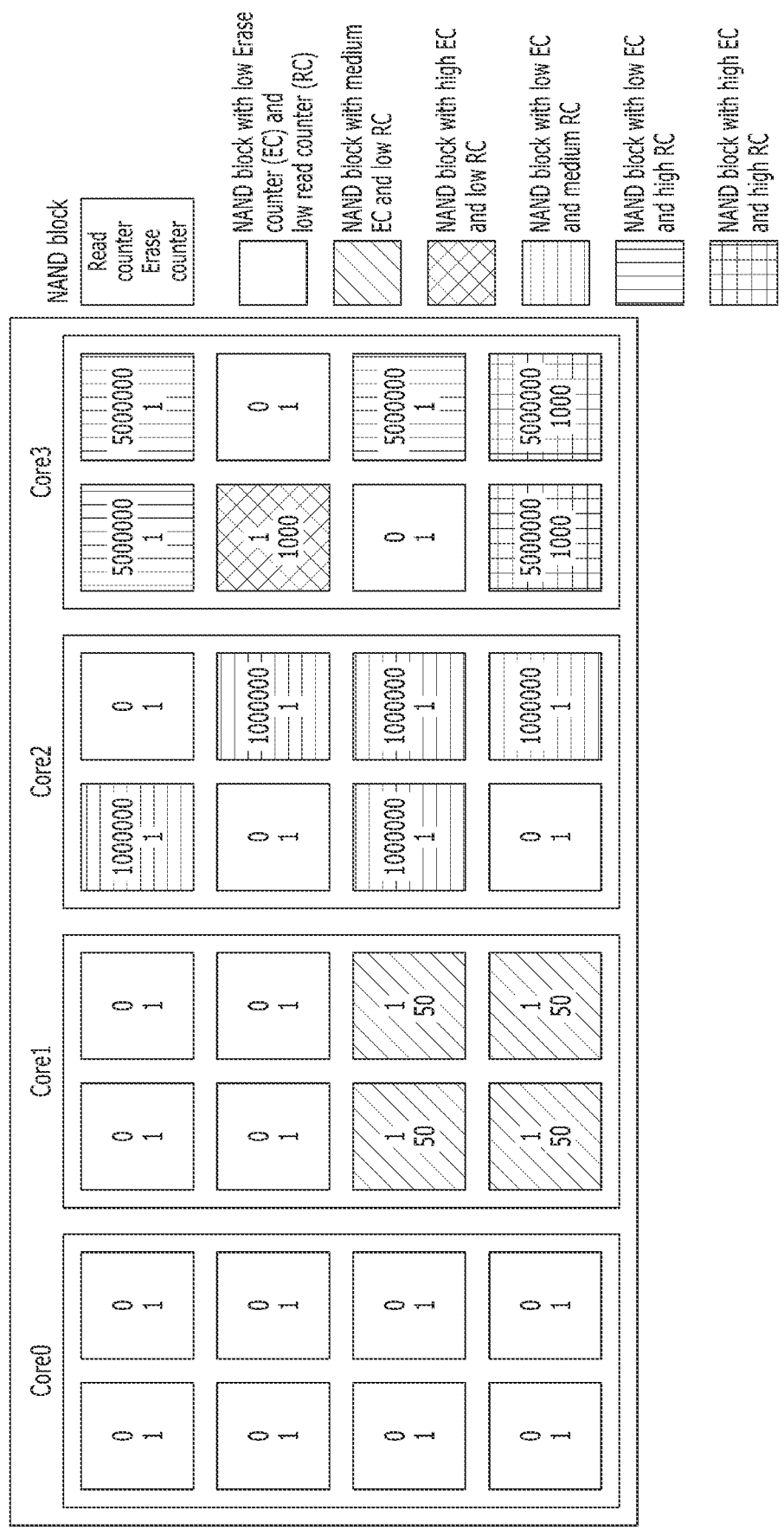

For the test scheme of FIG. 8, embodiments may provide two preconditions generation approaches as shown in FIGS. 9 and 10.

FIG. 9 is a diagram illustrating the same type of precondition with different parameters for different cores in accordance with an embodiment of the present invention.

Referring to FIG. 9, the same type of precondition, such as wear levelling (WL), read disturb (RD), etc., but with different parameters may be generated.

In the illustrated example of FIG. 9, the same type of precondition but with different parameters (i.e., erase counter values associated with WL) may be generated. NAND memory blocks associated with FTL core Core0 may get (have) the same WL state, i.e., an initial erase counter (EC) value of "1."

One half of NAND memory blocks (i.e., 4 upper NAND memory blocks) associated with FTL core Core1 may get the same WL state, i.e., the initial EC value of "1." The other half of NAND memory blocks (i.e., 4 lower NAND memory blocks) associated with FTL core Core1 may get the same low WL state, i.e., the EC value of "50."

One quarter of NAND memory blocks (i.e., 2 upper NAND memory blocks) associated with FTL core Core2 may get the same WL state, i.e., the initial EC value of "1."

Three quarters of NAND memory blocks (i.e., 6 lower NAND memory blocks) associated with FTL core Core2 may get the same medium WL state, i.e., the EC value of "100."

One half of NAND memory blocks (i.e., 4 NAND memory blocks) associated with FTL core Core3 may get the same WL state, i.e., the initial EC value of "1." The other half of NAND memory blocks (i.e., 4 NAND memory blocks) associated with FTL core Core3 may get the same high WL state, i.e., the EC value of "1000."

In an embodiment, WL may start when an EC value is greater than a set EC threshold 80. In this embodiment, no WL may occur on FTL cores 0 and 1, WL may start for a short time on FTL core 2, and WL may keep working for a long time on FTL core 3.

FIG. 10 is a diagram illustrating different types of preconditions for different cores in accordance with an embodiment of the present invention.

Referring to FIG. 10, the different types of preconditions, such as wear levelling (WL), read disturb (RD), etc., for different cores may be generated. In the illustrated example of FIG. 10, the different types of preconditions (i.e., erase counter (EC) values associated with WL and read counter (RC) values associated with RD) may be generated. NAND memory blocks associated with FTL core Core0 may get the low EC and low RC states, i.e., an EC value of "1" and a RC value of "0."

One half of NAND memory blocks (i.e., 4 upper NAND memory blocks) associated with FTL core Core1 may get the low EC and low RC states, i.e., the EC value of "1" and the RC value of "0." The other half of NAND memory blocks (i.e., 4 lower NAND memory blocks) associated with FTL core Core1 may get the medium EC and low RC states, i.e., the EC value of "50" and the RC value of "0."

Some of the NAND memory blocks (i.e., 3 NAND memory blocks) associated with FTL core Core2 may get the low EC and low RC states, i.e., the EC value of "1" and the RC value of "0." Others of the NAND memory blocks (i.e., 5 lower NAND memory blocks) associated with FTL core Core2 may get the low EC and medium RC states, i.e., the EC value of "1" and the RC value of "1000000."

Two NAND memory blocks associated with FTL core Core3 may get the low EC and low RC states, i.e., the EC value of "1" and the RC value of "0." One NAND memory block associated with FTL core Core3 may get the high EC and low RC states, i.e., the EC value of "1000" and the RC value of "0." Three NAND memory blocks associated with FTL core Core3 may get the low EC and high RC states, i.e., the EC value of "1" and the RC value of "5000000." Two NAND memory blocks associated with FTL core Core3 may get the high EC and high RC states, i.e., the EC value of "1000" and the RC value of "5000000."

In an embodiment, WL may start when an EC value is greater than a set EC threshold 80 and RD may start when a RC value is greater than a set RC threshold 500000. In this embodiment, no WL and RD may occur on FTL cores 0 and 1, RD may occur on FTL core 2, and WL and RD may occur on FTL core 3.

Although not shown and described, different types of preconditions may be combined in any way. In an embodiment, one core may start with the lack of spare blocks (which will trigger GC), another core lay have an imbalance of the erase counters (which will lead to WL), another core may suffer from high read counters (which will lead to read refresh or RD).

As described above, the test system 600 in FIG. 6 may test FTLs of the storage device 620 (e.g., a multicore SSD) based on various preconditions generation approaches as shown in FIGS. 9-10. Through two preconditions generation approaches, the test system 600 may provide different tests for different FTLs as shown in FIG. 8.

Figure 11:
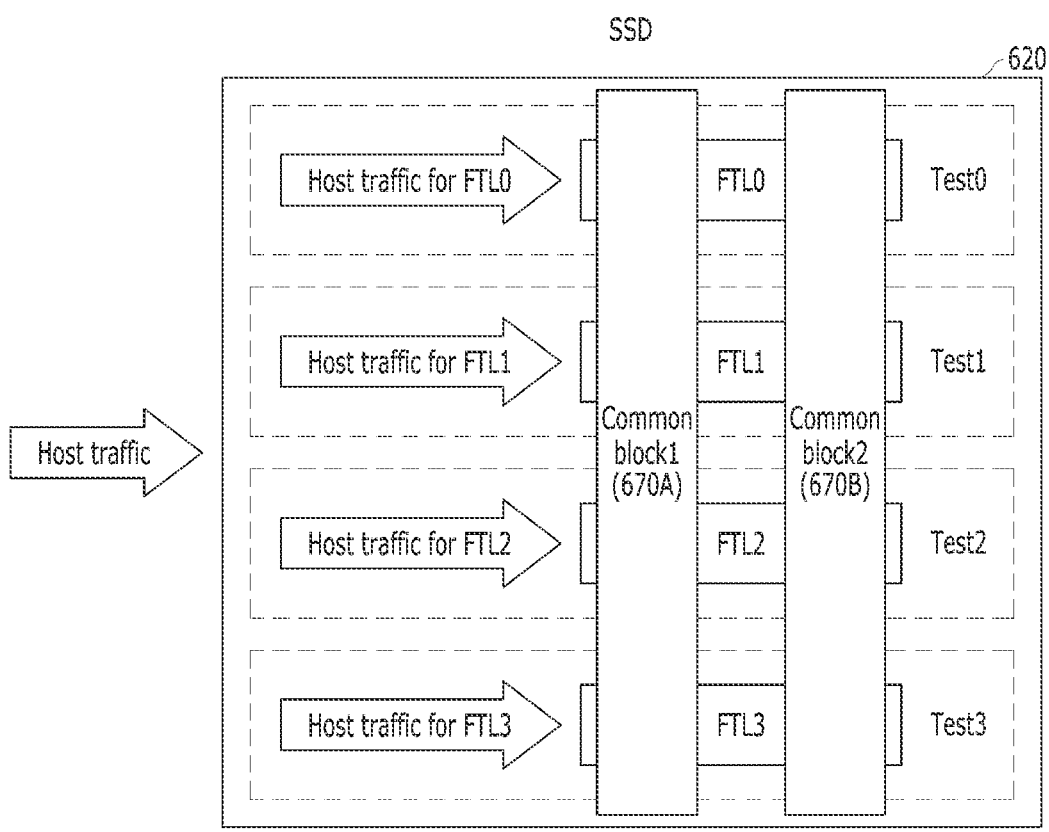
FIG. 11 is a diagram illustrating a multicore storage device in accordance with an embodiment of the present invention.

FIG. 11 is a diagram illustrating a multicore storage device 620 in accordance with an embodiment of the present invention.

Referring to FIG. 11, the multicore storage device (e.g., SSD) 620 may be tested through various preconditions generation approaches. That is, different tests for different FTLs may be provided for the multicore storage device 620. For this test scheme, all of the FTL cores may be independent of each other and states of all of the FTL cores may be shared, One or more common blocks 670A-670B may share states between all of the FTL cores. When the common blocks 670A-670B are optional, they may be disabled to ensure that tests on different FTL cores run independently.

In some embodiments, the structure of FIG. 11 may be used for global wear leveling (GWL) and a shared pool of reserved NAND blocks.

As described above, embodiments provide a scheme for test FTLs of a storage device (e.g., a multicore SSD) based on various preconditions generation approaches. This scheme may reduce the amount of resources required for SSD FW verification.

Although the foregoing embodiments have been illustrated and described in some detail for purposes of clarity and understanding, the present invention is not limited to the details provided. There are many alternative ways of implementing the Invention, as one skilled in the art will appreciate in light of the foregoing disclosure. The disclosed embodiments are thus illustrative, not restrictive. The present invention is intended to embrace all modifications and alternatives that fall within the scope of the claims. Furthermore, the embodiments may be combined to form additional embodiments.

What is claimed is:

1. A test system comprising:
a storage device including a plurality of flash translation layer (FTL) cores, each FTL core associated with multiple memory blocks; and
a test device configured to control the plurality of FTL cores to perform one or more test operations based on test preconditions generated for the plurality of FTL cores and provided to the plurality of FTL cores, the test preconditions including differing conditions, wherein each of the plurality of FTL cores performs the one or more test operations based on a corresponding test precondition of the test preconditions,
wherein the test preconditions include erase and read operation parameter values for each of the multiple memory blocks, and
wherein each FTL core selectively performs the one or more test operations on the multiple memory blocks based on the erase and read operation parameter values.

2. The test system of claim 1, wherein each of the test preconditions indicates a state of the multiple memory blocks.

3. The test system of claim 2, wherein the test preconditions have a same type of test preconditions with different parameter values.

4. The test system of claim 2, wherein the test preconditions are different types of test preconditions.

5. The test system of claim 1, wherein the test device is included in a real or virtual host device coupled to the storage device or is included in the storage device.

6. The test system of claim 1, wherein the one or more parameter values include an erase counter and a read counter for each of the multiple memory blocks,
- wherein each FTL core selectively performs the one or more test operations on the multiple memory blocks based on the read counter value and the erase counter value, and
- wherein each FTL core selectively performs the one or more test operations, including at least one of a wear leveling operation or a read disturb operation, on the multiple memory blocks based on the read counter value and the erase counter value.

7. A test system, comprising:
- a storage device including a plurality of flash translation layer (FTL) cores, each FTL core associated with multiple memory blocks; and
- a test device configured to generate test preconditions for the plurality of FTL cores and provide the test preconditions to the plurality of FTL cores, the test preconditions including differing conditions, wherein each of the plurality of FTL cores performs one or more test operations based on a corresponding test precondition of the test preconditions, wherein:
- each of the test preconditions indicates a state of the multiple memory blocks, and
- the test preconditions include an erase counter value and a read counter value for each of the multiple memory blocks.

8. The test system of claim 7, wherein each FTL core selectively performs the one or more test operations, including at least one of a wear leveling operation or a read disturb operation, on the multiple memory blocks based on the read counter value and the erase counter value.

9. The test system of claim 8, wherein each FTL core performs the wear leveling operation on the multiple memory blocks when an erase counter value is greater than an erase threshold.

10. The test system of claim 8, wherein each FTL core performs the read refresh operation on the multiple memory blocks when a read counter value is greater than a read threshold.

11. A method for testing a storage device including a plurality of flash translation layer (FTL) cores, each FTL core associated with multiple memory blocks, the method comprising:
- generating, by a test device, test preconditions for the plurality of FTL cores;
- providing, by the test device, the test preconditions to the plurality of FTL cores, the test preconditions being different from each other; and
- controlling the plurality of FTL cores to perform one or more test operations based on the test preconditions,
- wherein the test preconditions include differing conditions,
- wherein each of the plurality of FTL cores performs the one or more test operations based on a corresponding test precondition of the test preconditions,
- wherein the test preconditions include erase and read operation parameter values for each of the multiple memory blocks, and
- wherein each FTL core selectively performs the one or more test operations on the multiple memory blocks based on the erase and read operation parameter values.

12. The method of claim 11, wherein each of the test preconditions indicates a state of the multiple memory blocks.

13. The method of claim 12, wherein the test preconditions have a same type of test preconditions with different parameter values.

14. The method of claim 12, wherein the test preconditions are different types of test preconditions.

15. The method of claim 11, wherein the test device is included in a real or virtual host device coupled to the storage device or is included in the storage device.

16. The method of claim 11, wherein the one or more parameter values include an erase counter and a read counter for each of the multiple memory blocks,
- wherein each FTL core selectively performs the one or more test operations on the multiple memory blocks based on the read counter value and the erase counter value, and
- wherein each FTL core selectively performs the one or more test operations, including at least one of a wear leveling operation or a read disturb operation, on the multiple memory blocks based on the read counter value and the erase counter value.

17. A method for testing a storage device including a plurality of flash translation layer (FTL) cores, each FTL core associated with multiple memory blocks, the method comprising:
- generating, by a test device, test preconditions for the plurality of FTL cores;
- providing, by the test device, the test preconditions to the plurality of FTL cores, the test preconditions including differing conditions; and
- performing, by each of the plurality of FTL cores, one or more test operations based on a corresponding test precondition of the test preconditions, wherein the test preconditions include an erase counter value and a read counter value for each of the multiple memory blocks.

18. The method of claim 17, wherein each FTL core selectively performs the one or more test operations, including at least one of a wear leveling operation or a read disturb operation, on the multiple memory blocks based on the read counter value and the erase counter value.

19. The method of claim 18, wherein each FTL core performs the wear leveling operation on the multiple memory blocks when the erase counter value is greater than an erase threshold.

20. The method of claim 18, wherein each FTL core performs the read refresh operation on the multiple memory blocks when the read counter value is greater than a read threshold.

* * * * *